(12) United States Patent
Ranucci

(10) Patent No.: US 10,514,404 B2
(45) Date of Patent: Dec. 24, 2019

(54) CURRENT SENSOR CIRCUIT

(71) Applicant: Taiwan Semiconductor Manufacturing Company, Ltd., Hsinchu (TW)

(72) Inventor: Paul Ranucci, Leander, TX (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 302 days.

(21) Appl. No.: 15/604,700

(22) Filed: May 25, 2017

(65) Prior Publication Data

US 2018/0340964 A1 Nov. 29, 2018

(51) Int. Cl.
*G01R 27/26* (2006.01)
*H02M 3/155* (2006.01)
*H02M 1/08* (2006.01)
*H02M 1/00* (2006.01)

(52) U.S. Cl.
CPC ........... *G01R 27/2611* (2013.01); *H02M 1/08* (2013.01); *H02M 3/155* (2013.01); *H02M 2001/0009* (2013.01)

(58) Field of Classification Search
CPC ........... G01R 27/2611; G01R 19/0092; G01R 31/40; H02M 1/08; H02M 3/155; H02M 3/156; H02M 2001/0009
USPC .......... 324/600, 654, 425, 445, 454, 200, 324/207.15, 239, 241, 76.11, 76.55, 500, 324/522, 754.26, 713, 76.39, 76.69, 324/76.77, 111; 323/220, 223, 226, 232, 323/282, 284–286
See application file for complete search history.

(56) References Cited

U.S. PATENT DOCUMENTS

| | | | | |
|---|---|---|---|---|
| 7,432,690 B2* | 10/2008 | Williams | ........... | H05B 37/0218 323/222 |
| 9,899,921 B1* | 2/2018 | Paduvalli | ................. | G05F 1/00 |
| 9,983,233 B2* | 5/2018 | Kaya | ................. | G01R 19/0092 |
| 2008/0084201 A1* | 4/2008 | Kojori | ................ | G01R 19/0015 324/117 R |

* cited by examiner

*Primary Examiner* — Melissa J Koval
*Assistant Examiner* — Trung Nguyen
(74) *Attorney, Agent, or Firm* — Merchant & Gould P.C.

(57) ABSTRACT

A current sensor circuit is provided. The circuit includes a voltage integration circuit connected in parallel to an inductive element. The voltage integration circuit is configured to integrate an inductive element current through the inductive element between a first potential at a first end of the inductive element and a second potential a second end of the inductive element. The voltage integration circuit provides a voltage analog of the inductive element current. A voltage current convertor circuit is electrically connected to the voltage integration circuit. The voltage current convertor circuit is configured to convert the voltage analog of the voltage integration circuit to an output current that is proportional to the inductive element current.

19 Claims, 8 Drawing Sheets

CURRENT SENSOR CIRCUIT

BACKGROUND

The present disclosure relates to switched mode power supplies, and, more particularly to inductor current sensing in a switched mode power supply. Switched mode power supplies are becoming increasingly common as power supplies for a great variety of applications. In switched mode power supplies an input voltage is modulated by a switch and the modulated waveform is passed through an inductor, rectified and filtered to provide an output of controlled value. In order to control the switching and therefore the output, it can be helpful to know current passing through the inductor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
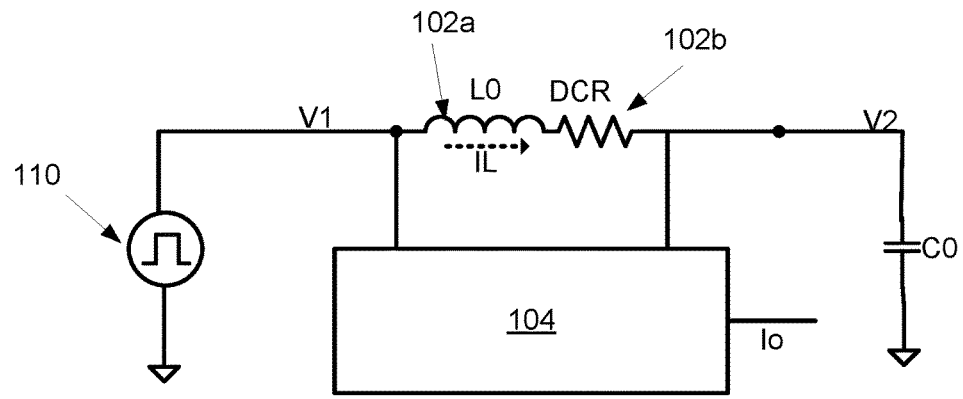
FIG. 1 is a component block diagram of an example environment including a current sensor circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Throughout the specification reference is made to inductors, resistors, and capacitors, which may also be referred to as respectively inductive elements, resistive elements, and capacitive/electrical storage elements. One skilled in the art will appreciate that inductors are one type of inductive element; resistors are one type of resistive element; and capacitors are one type of capacitive/electrical storage element.

According to some embodiments, a current sensor circuit for sensing inductor current is provided. The current sensor circuit (also referred to as a current sensor, or a current sense circuit) can be used to sense inductor current flowing through an inductor of a switched mode power supply. The current sensor circuit described herein relies on sensing a resistance value of the inductor (DCR) and creating an approximate replica of the current passing through the inductor for real time control, measurement, or limiting of the current. In some embodiments, the current sensor circuit provides a temperature invariant sense of the inductor current for unknown inductor sizes.

In some embodiments, the current sensor circuit includes an amplifier driving two matched current sources, an RC network, and two resistors of similar temperature coefficient to the inductor DCR. A bandwidth of the amplifier is greater than the switching frequency, and its common mode range is that of the inductor output. The amplifier operates continuously and replicates the inductor current waveform. The current sensor circuit described herein obviates a need for cutoff switches or blanking circuitry to measure inductor current of switched mode power supplies.

Referring to FIG. 1, a component block diagram of an example environment including a current sensor circuit is provided. As shown in FIG. 1, the example environment includes a current sensor circuit 104 connected across an inductor L0 102a. Inductor L0 102a may be part of a switched mode power supply (SMPS). For example, and as shown in FIG. 1, inductor L0 102a is connected between a voltage source 110 and a constant voltage (i.e. ground). An input voltage provided by voltage source 110 is modulated by one or more switches (not shown) and the modulated waveform is passed through inductor L0 102a. Inductor L0 102a includes an associated direct current (DC) resistance DCR 102b. Although DCR 102b is shown to be a separate component, DCR 102b is an inherent resistance value of inductor 102a.

Figure 8:
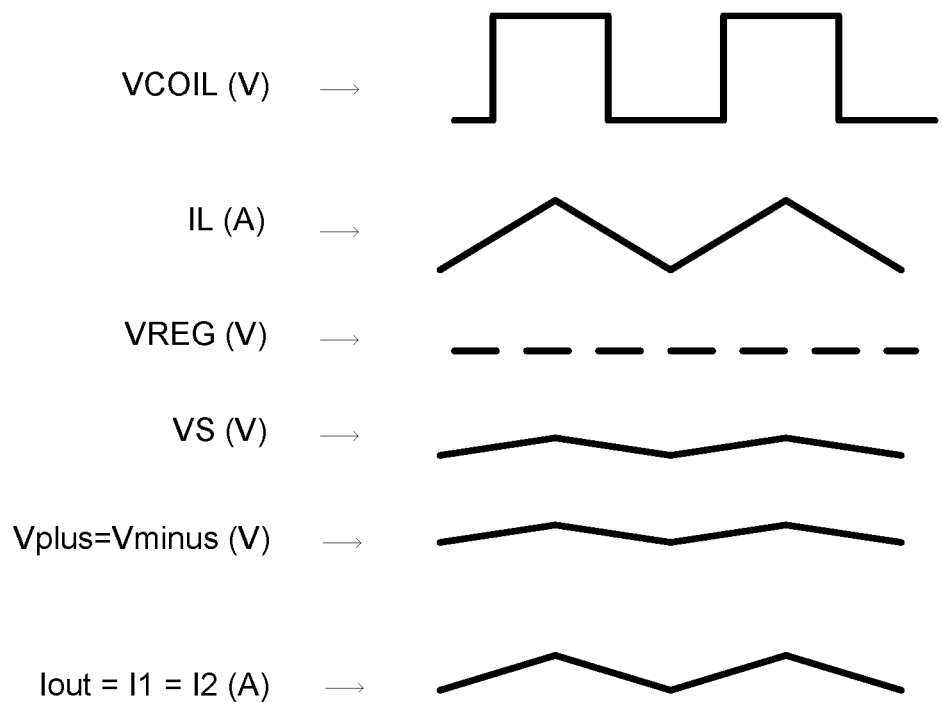
FIG. 8 is a timing diagram illustrating an operation flow of a current sensor circuit, in accordance with some embodiments.

During the operation of the SMPS, voltage source 110 is modulated by one or more switches, and the modulated waveform is passed through inductor L0 102a, rectified, and filtered to provide an output of controlled value. An example waveform of voltage source 110 is shown as VCOIL (V) in FIG. 8. As illustrated in FIG. 8, the waveform of source 110 is typically a square wave. However, it may be apparent to a person with skill in the art after reading this disclosure that the source waveform VCOIL(V) is not a perfect square waveform but a substantial square waveform.

Voltage source 110 induces an inductor current (IL) through inductor 102a. The shape of the inductor current is also induced by the waveform of voltage source 110. The inductor current IL is therefore a triangle wave. An example of a waveform of the inductor current though inductor L0 102a is shown as IL(A) in FIG. 8.

Current sensor circuit 104 is connected in parallel to inductor L0 102a. Current sensor circuit 104 is configured to sense the inductor current IL flowing through inductor L0 102a and provide an output current (Io, or Iout) which is proportional to the sensed inductor current. That is, current sensor circuit 104 performs the function of reproducing the inductor current IL through inductor L0 102a as a scaled current Io.

Figure 1A:
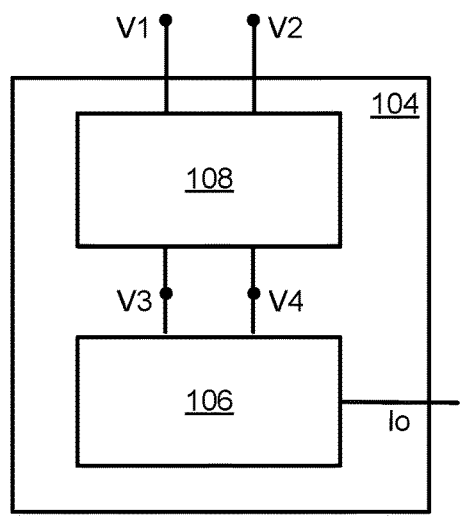
FIG. 1A is a component block diagram of a current sensor circuit, in accordance with some embodiments.

FIG. 1A provides a component block diagram of current sensor circuit 104. As illustrated in FIG. 1A, current sensor circuit 104 includes a voltage current convertor circuit 106 (also referred to as voltage current convertor) and an integration circuit 108 (also referred to as an integrator or current to a voltage convertor). Integration circuit 108 is connected in parallel to inductor L0 102a. For example, and as shown in FIG. 1A, a first end of integration circuit 108 includes two input points. These two input points are connected across inductor L0 102a. For example, a first input point of integration circuit 108 is connected to a first end of inductor L0 102a at a first potential voltage V1, and a second input point of integration circuit 108 is connected to a second end of inductor L0 102a at a second potential voltage V2.

Integration circuit 108 is configured to integrate the inductor current IL of inductor L0 102a. For example, integration circuit 108 may integrate the inductor current IL between the first potential V1 at the first end of inductor L0 102a and the second potential V2 at the second end of inductor L0 102a. The first potential V1 is also referred to as coil voltage (that is, VCOIL). The second potential V2 is also referred to as a constant voltage (that is, VREG). Integration circuit 108 is also referred to a voltage integration circuit 108.

Integration circuit 108 integrates the inductor current IL and provides a voltage analog corresponding to the inductor current IL. The voltage analog is a voltage representative of or analogous to the inductor current IL. For example, and as shown in FIG. 1A, integration circuit 108 provides a voltage analog Vs as difference between a third potential V3 and fourth potential V4 at its output points. The shape of the voltage analog Vs is similar to the inductor current IL waveform. An example of a waveform of the voltage analog Vs is shown as Vs(V) in FIG. 8. An example circuit diagram of integration circuit 108 is provided with respect to FIG. 2A to be discussed later.

Voltage current convertor circuit 106, as shown in FIG. 1A, is connected to the output points of integration circuit 108. For example, a first input point of voltage current convertor circuit 106 is connected to a first output point of integration circuit 106 at the third potential V3. Additionally, a second input point of voltage current convertor circuit 106 is connected to a second output point of integration circuit 106 at the fourth potential V4. Voltage current convertor circuit 106 is configured to convert the voltage analog Vs provided by integration circuit 108 to the output current Io which is proportional to the inductor current IL. That is, voltage current convertor circuit 106 performs the function of reproducing the inductor current IL as a scaled output current Io. A component block diagram of voltage current convertor circuit 106 is illustrated in FIG. 1B.

Figure 1B:
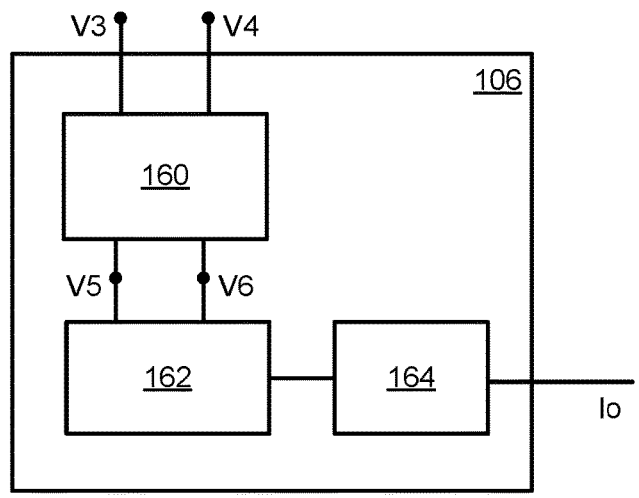
FIG. 1B is a component block diagram of a voltage current convertor, in accordance with some embodiments.

FIG. 1B provides a component block diagram of voltage current convertor circuit 106. As illustrated in FIG. 1B, voltage current convertor circuit 106 includes a gain circuit 160, a feedback circuit 162, and a replication circuit 164. Gain circuit 106 is configured to amplify the voltage analog Vs provided by integration circuit 108. Input points of gain circuit 160 are connected to output points of integration circuit 108. For example, a first input point of gain circuit 160 is connected to a first output point of integration circuit 106 at the third potential V3. Similarly, a second input point of gain circuit 160 is connected to a second output point of integration circuit 106 at the fourth potential V4.

As illustrated in FIG. 1B, gain circuit 160 provides the amplified analog voltage Vs across its output points. For example, gain circuit 160 amplifies the third potential V3 at the first input to a fifth potential V5 and amplifies the fourth potential V4 at the second input to a sixth potential V6. The amplified analog voltage Vs is determined as a difference between the fifth potential and the sixth potential (that is amplified Vs=V5−V6). An example circuit diagram for gain circuit 160 is illustrated with respect to FIG. 2B to be discussed later.

The amplification of the voltage analog Vs by gain circuit 160 is regulated by feedback circuit 162. Feedback circuit 162 is connected to gain circuit 160 at its output points. Feedback circuit 162 is configured to inject matched currents into gain circuit 160 to maintain the fifth potential V5 and the sixth potential V6 substantially equal in magnitude. For example, feedback circuit 162 injects two matched currents through the two output points of gain circuit 160. Feedback circuit 162 operates in a feedback loop configuration to control an amount of matched currents being injected into gain circuit 160. An example circuit diagram of feedback circuit 162 is illustrated with respect to FIG. 2C to be discussed later.

Feedback circuit 162 is configured to drive replication circuit 164. For example, replication circuit 164 is connected to an output point of feedback circuit 162. Replication circuit 164 provides the output current Io which is proportional to the inductor current IL. An example circuit diagram for replication circuit 164 is illustrated with respect to FIG. 2D to be discussed later.

Figure 2A:
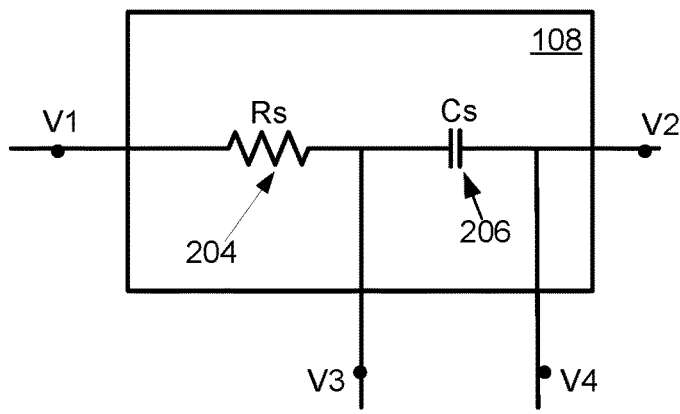
FIG. 2A is a schematic diagram of an integration circuit, in accordance with some embodiments.

Referring to FIG. 2A, a circuit diagram of integration circuit 108 is provided. As shown in FIG. 2A, integration circuit 108 includes a resistor Rs 204 and a capacitor Cs 206. Resistor Rs 204 is connected to capacitor Cs 206 (also referred to as first capacitor 206) in series. That is, and as illustrated in FIG. 2A, a first end of resistor Rs 204 is connected to the first end of inductor L0 102a at the first potential V1. A second end of resistor Rs 204 is connected to a first end of capacitor Cs 206. A second end of first capacitor 206 is connected to the second end of inductor L0 102a at the second potential V2. In some embodiments, a temperature coefficient of resistor Rs 204 matches with the temperature coefficient of DCR 102b. For example, a resistance gain of resistor Rs 204 over temperature is substantially similar to that of DCR 102b.

In some embodiments, and as illustrated in FIG. 2A, integration circuit 108 is connected in parallel to inductor L0 102a and is configured to integrate the inductor current IL flowing through inductor L0 102a and provide the voltage analog Vs of the inductor current IL. For example, and as illustrated in FIG. 2A, integration circuit 108 integrates the inductor current IL between the voltages across inductor 102a (that is, between V1 and V2) and provides a corresponding voltage analog Vs as a voltage across capacitor Cs 206 (i.e. Vs=V3−V4). The voltage analog Vs provided by integration circuit 108 is proportional to the inductor current IL multiplied by inductor's L0 102a DC resistance DCR 102b given that a time constant RsXCs is matched to L/DCR of inductor L0 102a. Hence, integration circuit 108 is configured to provide the voltage analog Vs which substantially follows the inductor current IL. A waveform of the voltage analog Vs is a triangle wave and is depicted as Vs(V) in FIG. 8.

In an embodiment, and as illustrated in FIG. 2A, the second potential V2 and fourth potential V4 are both equal in magnitude. In some embodiments, although integration circuit 108 is shown to include an RC circuit with one resistor and one capacitor, it may be apparent to a person with ordinary skill in the art after reading this disclosure that integration circuit 108 may be a different type of circuit, and may include a variable number of resistors and capacitors.

Figure 2B:
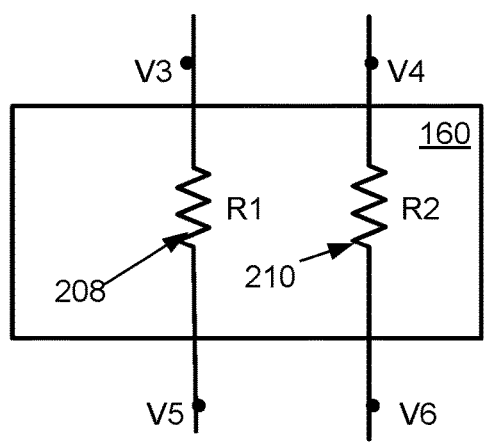
FIG. 2B is a schematic diagram of a gain circuit, in accordance with some embodiments.

Referring to FIG. 2B, a circuit diagram of gain circuit 160 (also referred to as a resistive gain circuit) is provided. As shown in FIG. 2b, gain circuit 160 includes a first resistor R1 208 and a second resistor R2 210. A first end of first resistor R1 208 is connected to the third potential V3, that is, to a first end of capacitor Cs 206. A first end of second resistor R2 210 is connected to the fourth potential V4, that is, to a second end of capacitor Cs 206. Hence, first resistor R1 208 and second resistor R2 210 are connected in parallel to each other across capacitor Cs 206. In some embodiments, temperature coefficients of first resistor R1 208 and second resistor R2 210 match with that of DCR 102b. That is a resistance gain of first resistor R1 208 and second resistor R2 210 over temperatures are substantially similar to that of DCR 102b. In an embodiment, a resistance value of first resistor R1 208 and second resistor R2 210 are substantially identical or scaled multiples of each other. For example, a resistance value of first resistor R1 208 is twice the resistance value of second resistor R2 210.

As discussed above, gain circuit 160 is configured to amplify the voltage analog Vs provided by integration circuit 108. For example, gain circuit 160 amplifies the voltage analog Vs by a predetermined amount. In some embodiments, an amount of amplification is determined based on resistance values of first resistor R1 208 and second resistor R2 210. The amplified voltage analog Vs is provided as a voltage across output points of gain circuit 160. For example, and as shown in FIG. 2B, gain circuit 160 amplifies the third potential V3 to a fifth potential V5 provided at a first output point and amplifies the fourth potential V4 to a sixth potential V6 provided at a second output point. An example waveform of amplified voltage analog Vs provided by gain circuit 160 is provided in FIG. 8 as Vplus=Vminus (V) waveform.

In some embodiments, although gain circuit 160 is shown to be a resistive gain circuit, it will be apparent to a person with ordinary skill in the art after reading this disclosure that gain circuit 160 may include other types of gain circuits to amplify the voltage analog Vs. Moreover, although gain circuit 160 is shown to include only two resistors and connected in parallel to each other, it will be apparent to a person with ordinary skill in the art after reading this disclosure that gain circuit 160 may include a variable number of resistors and other types of configurations to amplify the voltage analog Vs.

Figure 2D:
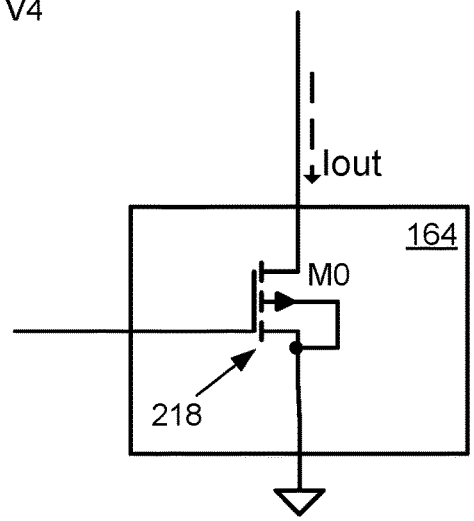
FIG. 2D is a schematic diagram of a replication circuit, in accordance with some embodiments.
Figure 2C:
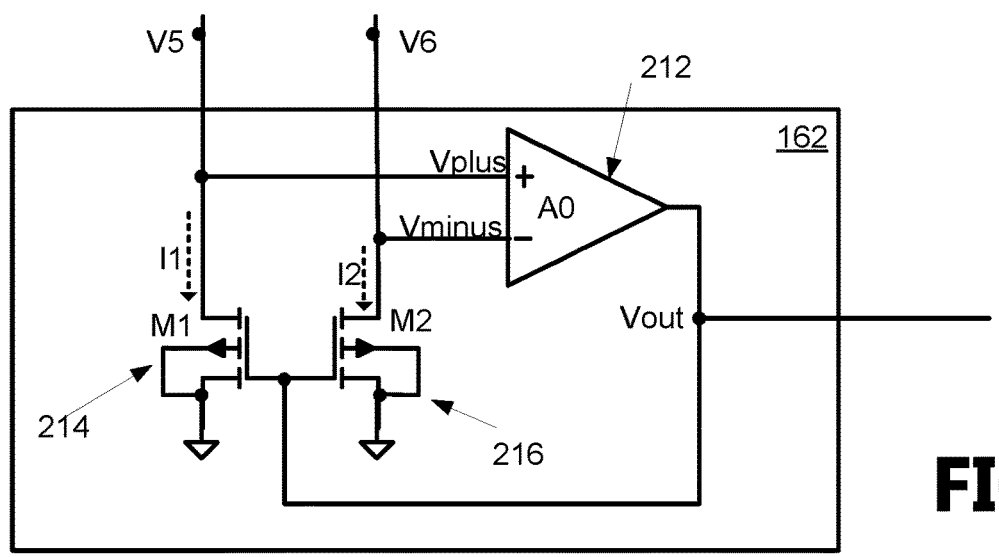
FIG. 2C is a schematic diagram of a feedback circuit, in accordance with some embodiments.

Referring to FIG. 2C, a circuit diagram of feedback circuit 162 is provided. As shown in FIG. 2C, feedback circuit 162 includes an amplifier A0 212, a first current source M1 214, and a second current source M2 216. In some embodiments, amplifier A0 212 is a comparator. Amplifier 212 is connected in a feedback mode with the current sources. The current sources, that is, first current source M1 214 and second current source M2 216, are matched current sources. In some embodiments, first current source M1 214 and second current source M2 216 are identical or scaled multiples of each other.

As shown in FIG. 2C, feedback circuit 162 includes two input points which are connected to output points of gain circuit 160. For example, a first input point of feedback circuit 162 is connected to a first output point of gain circuit 160 at the fifth potential V5. Similarly, a second input point of feedback circuit 162 is connected to a second output point of gain circuit 160 at the sixth potential V6. In addition, and as shown in FIG. 2C, two input points of amplifier A0 212 are connected across the amplified voltage analog provided by gain circuit 160. For example, a first input Vplus of amplifier A0 212 is connected to the first output point of gain circuit 160 at the fifth potential V5. Similarly, a second input Vminus of amplifier A0 212 is connected to the second output point of gain circuit 160 at the sixth potential V6.

In some embodiments, amplifier A0 212 compares one voltage level with another voltage level (i.e. V5 and V6, or Vplus and Vminus) and produces an output voltage Vout based on the comparison. Alternatively, amplifier A0 212 compares magnitudes of two voltage inputs (V5 and V6, or Vplus and Vminus) and determines which is the greater of the two. For example, the output voltage Vout of amplifier A0 212 is provided as Vout=A0(Vplus−Vminus), where A0 is an open loop gain of amplifier A0 212.

As shown in FIG. 2C, the output point of amplifier 212 is connected to gates of first current source M1 214 and second current source M2 216. In some embodiments, first current source M1 214 and second current source M2 216 are matched current sources configured to inject a first current I1 and a second current I2, respectively, into gain circuit 160. For example, and as shown in FIG. 2C, a first end of first current source M1 214 is connected to the first output of gain circuit 160. Similarly, and as shown in FIG. 2C, a first end of second current source M2 216 is connected to the second output of gain circuit 160. As a result, first current source M1 214 is configured to inject the first current I1 into gain circuit 160 through the first output end of gain circuit 160. Similarly, second current source M2 216 is configured to inject the second current I2 into gain circuit 160 through the second output end of gain circuit 160. In some embodiments, first current source M1 214 and second current source M2 216 are field effect transistors (FETs) or more particularly NFETs.

In some embodiments, the amount of matched currents I1 and I2 being injected into gain circuit 160 is controlled by amplifier A0 212. For example, and as shown in FIG. 2C, amplifier A0 212 is used in feedback mode to control a magnitude of matched currents I1 and I2 being injected into gain circuit 160. The output voltage Vout of amplifier A0 212 is provided to gates of first current source M1 214 and second current source M2 216 thereby controlling the amount of the first current I1 and the second current I2 being injected into gain circuit 160 by first current source M1 214 and second current source M2 216 respectively. In some embodiments, the amount of the first current I1 and the second current I2 are controlled such that the fifth potential V5 and the sixth potential V6 at the output points of gain circuit 160 are substantially equal (that is, V5=V6). In another embodiment, the amount of the first current I1 and the second current I2 are controlled such that they are substantially equal to each other (that is, I1=I2). Substantial means within plus or minus five percent throughout this specification.

Referring to FIG. 2D, a circuit diagram of replication circuit 164 is provided. As shown in FIG. 2D, replication circuit 164 includes a third current source M0 218. Third current source M0 218 is a matched current source and includes a field effect transistor (FET) or more particularly NFET. In an embodiment, third current source M0 218 is matched to first current source M1 214 and second current source M2 216. For example, third current source M0 218 is operative to provide the output current Iout which is substantially equal to an amount of current being injected by first current source M1 214 and second current source M2 216 into gain circuit 160. A gate of third current source M0 218 is connected to the output point of amplifier A0 212. As a result, amplifier A0 212 is configured to drive third current source M0 218 such that an output current Iout of third current source 218 is proportional to the inductor current IL.

In some embodiments, although the current sources M0 218, M1 214, and M2 216 are shown to be NFETs, it will be apparent to a person with ordinary skill in the art after reading this disclosure that each of current sources M0 218, M1 214, and M2 216 may include other varieties of FETs, or other type of current sources.

Figure 3:
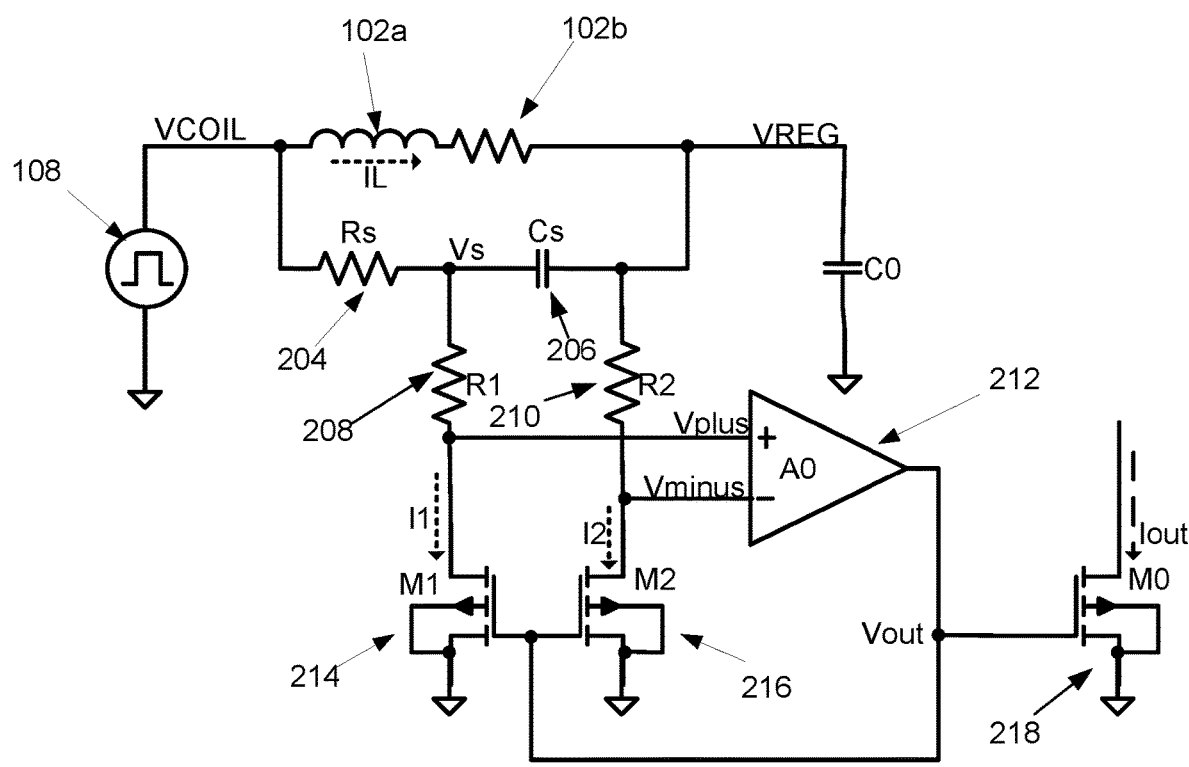
FIG. 3 is a schematic diagram of a first current sensor circuit, in accordance with some embodiments.

Referring to FIG. 3, a circuit diagram of a current sensor circuit connected to an inductor L0 102a is provided. In an embodiment, the current sensor circuit of FIG. 3 includes voltage current convertor circuit 106 and integration circuit 108 which includes gain circuit 160, feedback circuit 162, and replication circuit 164. For example, resistor Rs 204 and first capacitor Cs 206 form current convertor circuit 106; first resistor R1 208 and second resistor R2 210 form gain circuit 160, amplifier A0 212, first current source M1 214, and second current source M2 216 form feedback circuit 162, and third current source 218 forming replication circuit 164. As discussed previously, the current sensor circuit performs the function of reproducing the inductor current IL as a scaled output current Iout which is proportional to the inductor current IL.

As shown in FIG. 3, one end of inductor L0 102a is at relatively constant voltage Vreg and the other end is driven by a square wave VCOIL. An RC network's Rs 204 and Cs 206 connected between VCOIL and VREG integrates the inductor current IL from VCOIL to VREG and produces a voltage analog Vs signal triangle waveform across Cs 206. In some embodiments the voltage analog Vs is proportional to the inductor current IL in inductor L0 102a multiplied by inductor's L0 102a DC resistance DCR 102b given that the time constant RsXCs is matched to the L/DCR of inductor L0 102a. A voltage current convertor circuit 106 including amplifier A0 212, NFETs M0 218, M1 214, and M2 216 and resistors R1 208 and R2 208 is a voltage to current convertor circuit which takes sensed voltage across capacitor Cs 206 and turns it into output current Io. In some embodiments, M0 218, M1 214, and M2 216 are identical matched FETs or scaled multiples of each other. For example, first current source M1 214 and second current source M2 216 inject substantially equal amount of currents into first resistor R1 208 and second resistor 210 respectively. In another example, first current source M1 214 injects a scaled multiple, for example, twice an amount, of current being inject by second current source 216. R1 208 and R2 210 are likewise scaled multiples or substantially identical to each other. For example, a resistance value of first resistor R1 208 is substantially equal to or greater than the resistance value of second resistor R2 210. In another example, a temperature gain coefficient of first resistor R1 208 is substantially similar to the temperature gain coefficient of second resistor R2 210. The relative sizing of R1 208 and R2 210 in relation to Rs 204 and DCR 102b determines gain of current sensor circuit. In some embodiments, the sizing of R1 208 and R2 210 may have limits for stability and practicality concerns as discussed below.

In some embodiments, for a case in which M0=M1=M2, I0=I1=I2, and R1>R2, the DC gain of the current sensor circuit is determined as:

$$IO/IL = DCR/(Rs+R1-R2) \quad (1)$$

In an embodiment, a time constant for inductor 102a is determined as L/DCR and the time constant for current integration circuit 108 is determined as CsXRs. In order to reproduce the inductor current IL accurately over frequency, the time constant of the current sensor circuit including R1 208 and R2 210 are matched to the L/DCR time constant leading to a relationship:

$$L/DCR = CsXRs/(R1-R2) \quad (2)$$

Values for resistor Rs 204, capacitor Cs 206, first resistor R1 208, and second resistor R2 210 which provide a reasonable scale factor for the inductor current IL are selected based on the time constant constraint. For example, the values for resistor Rs 204, capacitor Cs 206, first resistor R1 208, and second resistor R2 210 are determined based on the time constant constraint of equation (2). In addition, the values of resistor Rs 204, capacitor Cs 206, first resistor R1 208, and second resistor R2 210 are determined to meet the constraints of equation (1). For example, in order to maintain a constant gain over temperature, temperature coefficients of R1 208 and R2 210 match that of the DCR 102b. Since most inductors are made from Copper, resistors Rs 204, R1 208, and R2 210 have similar temperature coefficients to maintain constant gain over temperature.

Figure 4:
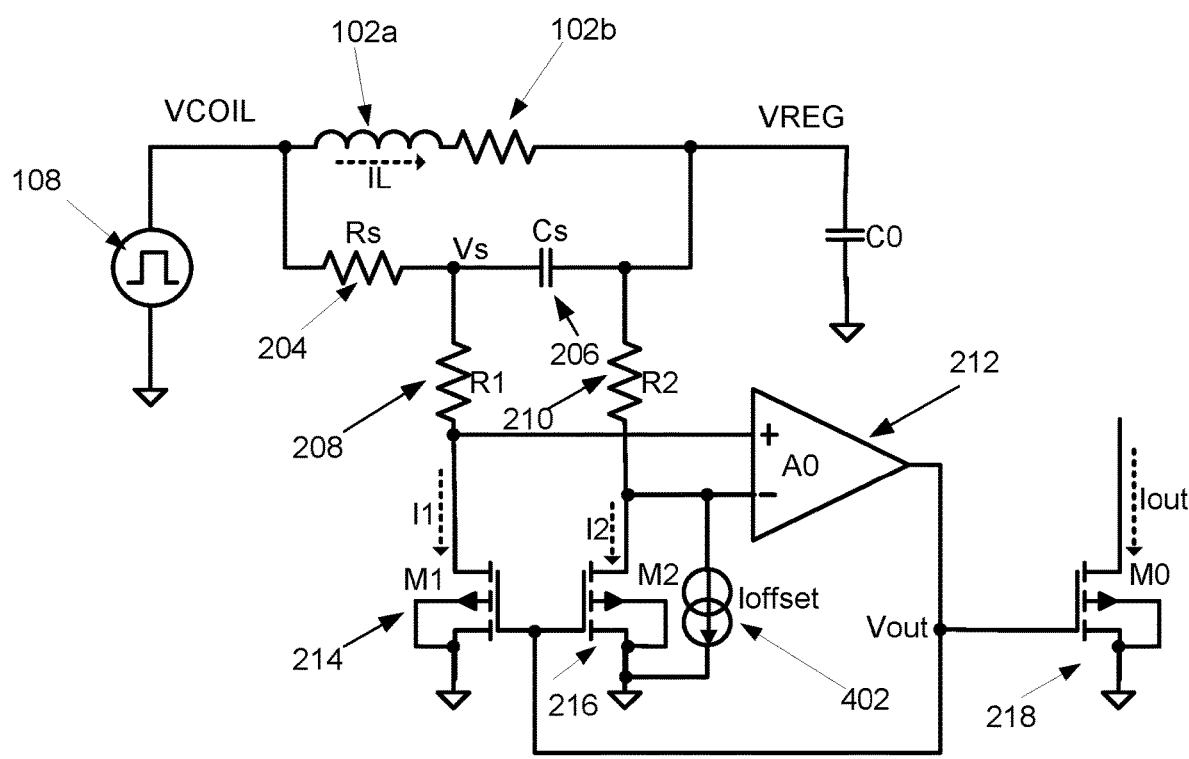
FIG. 4 is a schematic diagram of a second current sensor circuit, in accordance with some embodiments.

Referring to FIG. 4, a circuit diagram of current sensor circuit with an addition of an offset current Ioffset 402 is provided. In an embodiment, the current sensor circuit of FIG. 4 includes voltage current convertor circuit 106 and integration circuit 108 which includes gain circuit 160, feedback circuit 162, and replication circuit 164 (not shown). For example, resistor Rs 204 and first capacitor Cs 206 form current convertor circuit 106; first resistor R1 208 and second resistor R2 210 form gain circuit 160, amplifier A0 212, first current source M1 214, and second current source M2 216 form feedback circuit 162, and third current source 218 forming replication circuit 164. In addition, the current sensor circuit of FIG. 4 includes offset current Ioffset 402.

As shown in FIG. 4, offset current Ioffset 402 is connected across second current source M2 216. Although, offset current Ioffset 402 is shown to be connected across second current source M2 216, it will be apparent to a person with skill in the art after reading this disclosures that offset current Ioffset 402 may be connected across first current source M1 216 or may be connected across both of current sources M1 214 and M2 216. Offset current Ioffset 402 allows a single ended output current Iout to represent both positive and negative inductor current IL. In an embodiment, amplifier's A0 212 bandwidth and slew rate is high enough to track the inductor current waveform which would be at the switching frequency of a convertor associated with the switched mode power source. The addition of offset current Ioffset 402 across one of the matched current sources obviates a need for additional cutoff or blanking switches in amplifier A0 212 as it operates continuously within a fairly constant input voltage. A common mode range of amplifier A0 212 includes the range of VREG for which the inductor current IL measurement is desired. In a buck convertor, for example, the range of VREG would include an output voltage range of the buck convertor. In a boost convertor, however, the range of VREG would include an input voltage range of the boost convertor.

Figure 5:
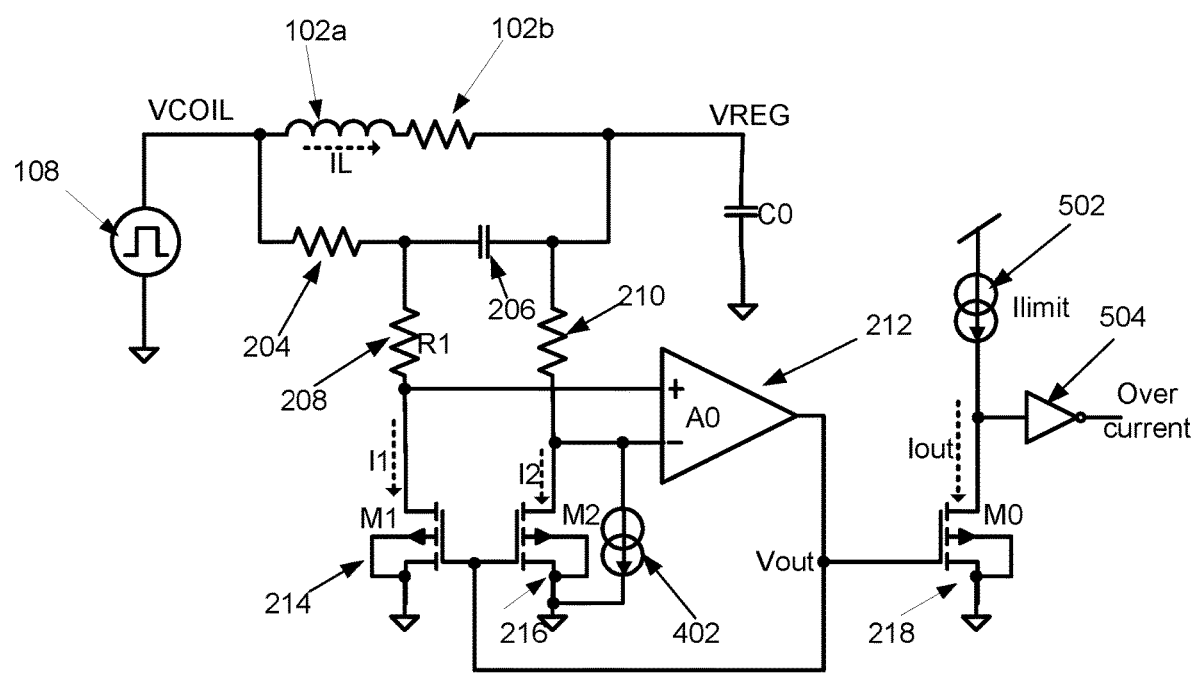
FIG. 5 is a schematic diagram of a third current sensor circuit, in accordance with some embodiments.

Referring to FIG. 5, a circuit diagram of a current sensor circuit with addition of an overcurrent detector is provided. In an embodiment, the current sensor circuit of FIG. 5 includes voltage current convertor circuit 106 and integration circuit 108 which includes gain circuit 160, feedback circuit 162, and replication circuit 164 (not shown). For example, resistor Rs 204 and first capacitor Cs 206 form current convertor circuit 106; first resistor R1 208 and second resistor R2 210 form gain circuit 160, amplifier A0 212, first current source M1 214, and second current source M2 216 form feedback circuit 162, and third current source 218 forming replication circuit 164. In an embodiment, the addition of an independent current source Ilimit 502 and an inverter 504 creates an overcurrent detector. Inverter 504 compares the output current Iout which is proportional to the inductor current IL with Ilimit 502 and produces an output based on the comparison. For example, the output (that is, the over current) signal is high any time that the inductor current IL is higher than Ilimit 502 times a scaling factor. The scaling factor is configurable and may be dynamically changed.

In some embodiment for high bandwidth sensing the current limit Ilimit 502 would be a peak current limit. However, if the RsXCs time constant is purposely skewed higher so that the output current Iout is a low passed version of the inductor current IL then the output current Iout would be an average current limit.

Figure 6:
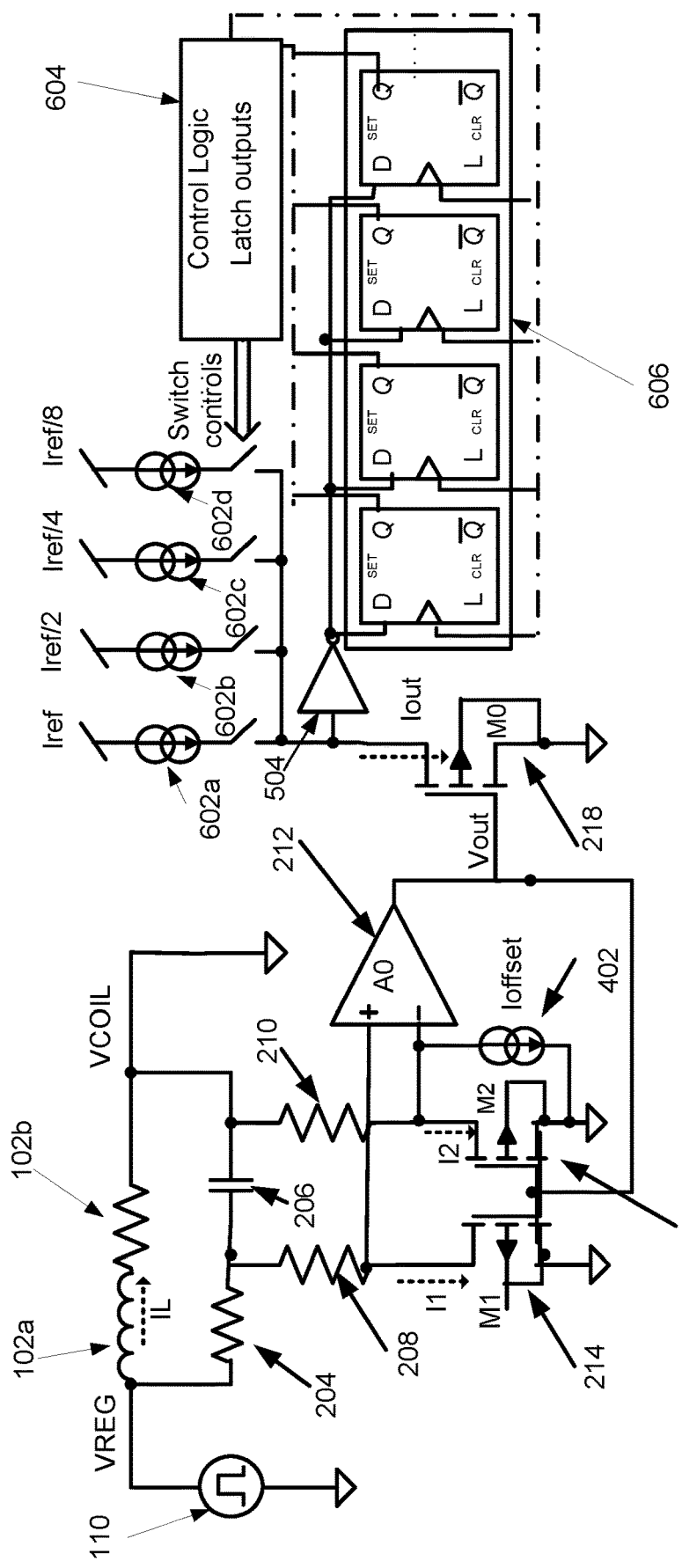
FIG. 6 is a schematic diagram of a fourth current sensor circuit, in accordance with some embodiments.

Referring to FIG. 6, a circuit diagram of a current sensor circuit which provides a digital output corresponding to the inductor current IL. The current sensor circuit illustrated in FIG. 6 provides the digital output through successive approximation. For example, the current sensor circuit illustrated in FIG. 6 is operative to convert a continuous analog waveform of the output current Iout which corresponds to the inductor current IL into a discrete digital representation via a binary search through possible quantization levels. The current sensor circuit of FIG. 6 includes voltage current convertor circuit 106 and integration circuit 108 which includes gain circuit 160, feedback circuit 162, and replication circuit 164 (not shown). For example, resistor Rs 204 and first capacitor Cs 206 form current convertor circuit 106; first resistor R1 208 and second resistor R2 210 form gain circuit 160, amplifier A0 212, first current source M1 214, and second current source M2 216 form feedback circuit 162, and third current source 218 forming replication circuit 164. In addition, the current sensor circuit of FIG. 6 includes invertor 504, control logic 604, latch bank 606, and multiple reference currents 602a, 602b, 602c, 602d (collectively 602). In some embodiments reference currents 602 are also referred to as weighted currents 602.

As illustrated in FIG. 6, third current source M0 218 is operative to provide the output current Iout which is proportional to the inductor current IL. The output current Iout is successively compared with one or more reference currents 602 to provide a digital output corresponding to the output current Iout. For example, control logic 604 is operative to initiate comparison of the output current Iout with a first reference current Iref 602a. Inverter 504 compares the output current Iout to first reference current Iref 602a and outputs a first bit as a response to the comparison. For example, inverter 504 outputs 1 or 0 based on whether the output current Iout is less than or greater than first reference current Iref 602a. The first bit is stored in a first latch of latch bank 606. In addition, depending on the whether the output current Iout is less than or greater than first reference current Iref 602a, control logic initiates comparison of the output current Iout with a second reference current Iref/2 602b. Inverter 504 outputs a second bit in response to the comparison with second reference current Iref/2 602b. The second bit is stored in a second latch of latch bank 606. In some examples, control logic 604 can be programmed to initiate a predetermined number of comparisons. The number of comparisons is determined based on a number of bits in the digital output. The bits stored in latch bank 606 is provided as the digital output representative of the inductor current IL.

Figure 7:
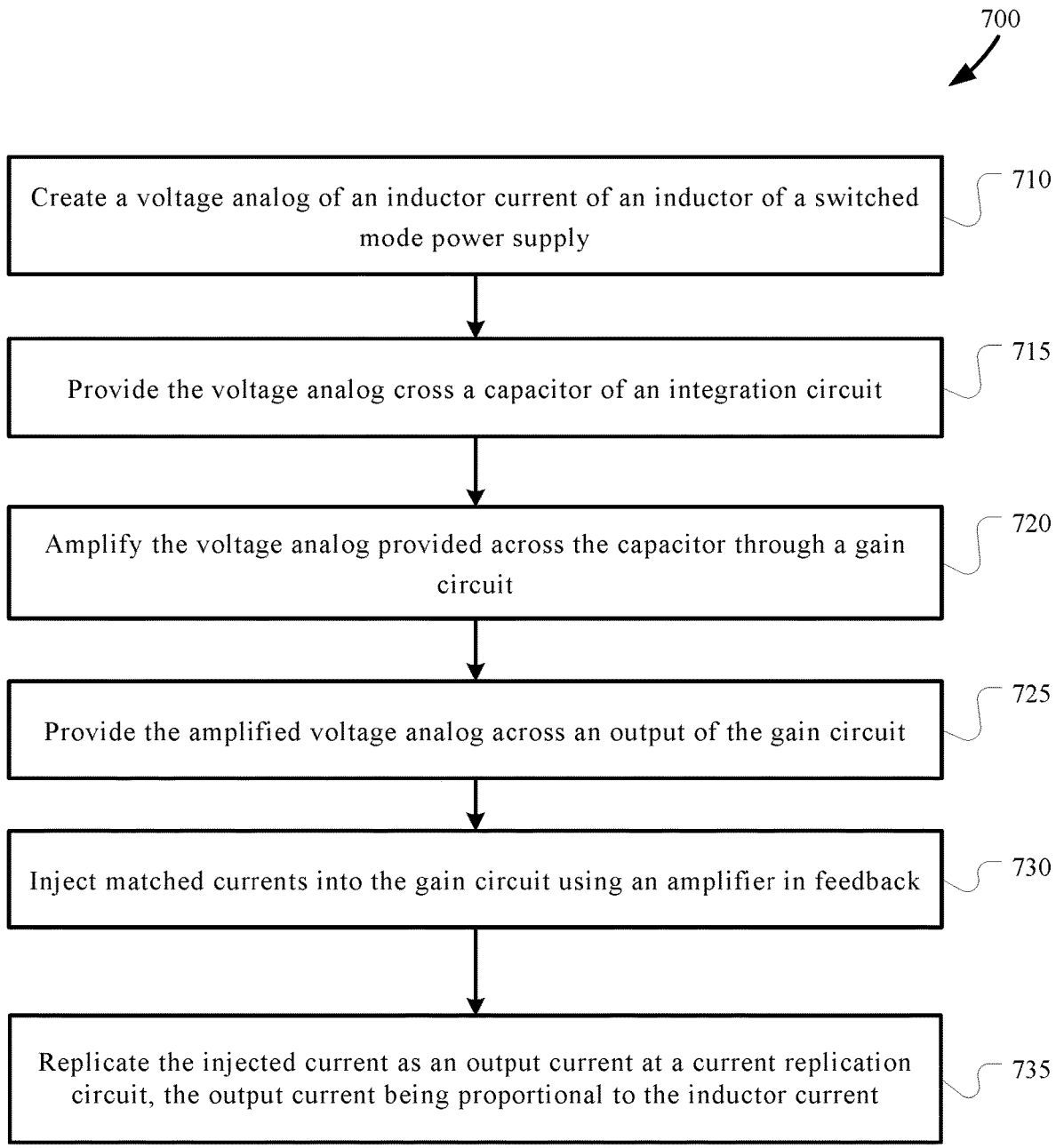
FIG. 7 is a flow diagram illustrating a method for determining an inductor current, in accordance with some embodiments.

Referring to FIG. 7, a flow diagram illustrating a method 700 for determining an inductor current IL is provided. Method 700 begin at operation 710, where a voltage analog Vs of an inductor current IL of an inductor L0 102a of a switched mode power supply table is created. For example, integration circuit 108 is connected in parallel to inductor L0 102a and integrates the inductor current IL between a first potential V1 (or VCOIL) at a first end of inductor L0 102a and a second potential V2 (or VREG) at a second end of inductor L0 102a to create the voltage analog Vs.

After creating the voltage analog at operation 710, method 700 proceeds to operation 715 where the created voltage analog Vs is provided across capacitor Cs 206 of integration circuit 108. For example, integration circuit 108 includes a resistor Rs 204 and capacitor Cs 206 connected in series to the Rs 204, and the voltage analog Vs created corresponding to the inductor current IL is provided across the capacitor Cs 206.

After providing the voltage analog Vs at operation 715, method 700 proceeds to operation 720 where the voltage analog Vs is amplified through gain circuit 160. For example, gain circuit 160 includes a first resister R1 208 and a second resistor R2 208 connected across the capacitor Cs 206. Gain circuit 160 amplifies the voltage analog Vs by a predetermined amount defined by resistance values of resistors R1 208 and R2 210.

After amplifying the voltage analog Vs at operation 720, method 700 proceeds to operation 725 where the amplified voltage analog Vs is provided across an output end of gain circuit 160. For example, the amplified voltage analog Vs is provided as a potential difference (Vplus-Vminus) across two output points at the second end of gain circuit 160.

After providing the amplified voltage at operation 725, method 700 proceeds to operation 730 where matched currents I1 and I2 are injected into gain circuit 160 using amplifier A0 212 in feedback. For example, feedback circuit 162 is connected at the second end of gain circuit 160. Feedback circuit 162 includes amplifier A0 212 and a pair of current sources M1 214, M2 216. Current sources M1 214 and M2 216 are connected to the two output points of gain circuit 160, and are configured to inject matched currents I1 and I2 into gain circuit 160 through the two output points. Two input points of amplifier A0 212 are also connected to the two output points of gain circuit 160. Output point of amplifier A0 212 is connected to controls, for example gates, of the matched current sources M1 214 and M2 216. Amplifier A0 212 is configured to regulate an amount of matched currents I1 and I2 being injected into gain circuit 160 such that a potential difference between the output points of gain circuit 160 is substantially equal to zero, that is, both output points of gain circuit 160 are at substantially at the same potential.

After injecting the matched currents at operation 730, method 700 proceeds to operation 735 where the injected matched currents is replicated as an output current Io at current replication circuit 164, the output current Io being proportional to the inductor current IL. For example, current replication circuit 164 includes a third matched current source M0 218. The output point of amplifier A0 212 is connected to the control, that is, the gate, of third matched current source M0 218. Amplifier A0 212, therefore, is configured to drive third matched current source M0 218 such that a waveform of the inductor current IL is replicated as the output current Io of third matched current source M0 218, and that the output current Io is proportional to the inductor current IL. Method 700 stops after providing the output current Io. In an embodiment, the methods described herein may be modified by substituting, reordering, skipping, or adding stages to the disclosed methods.

In some embodiments, current sensor circuit described with respect to FIGS. 1-6 eliminates the requirement of sensing only part of the inductor current during either an ontime or offtime, and having to deal with large common mode range swings at the inputs. The current sensor circuits further obviates limited amounts of time to setup. Hence, the current sensor circuit operates at a higher frequency and reduces design complexity of the amplifier. further In an embodiment, current sensor circuit described with respect to FIGS. 1-6 can be used in the field of switched mode power supplies. For example, the output current provided by the current sensor circuit can be used for control, feedback, current monitoring, overcurrent detection, power limiting, load line regulation, current sharing, phase shedding, and load balancing. In addition, the current sensor circuit applies to many convertor topologies, such as, buck convertor, boost convertor, buck-boost convertor, and sepic convertor.

In accordance with some embodiments, a circuit includes a voltage integration circuit connected in parallel to an inductive element, the voltage integration circuit being configured to integrate an inductive element current of the inductive element between a first potential at a first end of the inductive element and a second potential at a second end of the inductive element, and being further configured to provide a voltage analog corresponding to the integrated inductive element current; a voltage current convertor circuit electrically connected to the voltage integration circuit, the voltage current convertor circuit being configured to convert the voltage analog to an output current, the output current being proportional to the inductive element current.

In accordance to an embodiment, a current sensor circuit includes an integration circuit electrically connected in parallel to an inductive element of a switched mode power supply, the integration circuit being configured to provide a voltage analog of an inductive element current flowing through the inductive element; a gain circuit including a first end and a second end, the first end of the gain circuit being electrically connected to the integration circuit, and the gain circuit being configured to amplify the voltage analog and provide the amplified voltage analog at the second end; a feedback circuit electrically connected to the second end of the gain circuit, the feedback circuit being configured to drive matched currents into the gain circuit using an amplifier in feedback; and a replication circuit electrically connected to the feedback circuit, the replication circuit being configured to replicate the matched currents as an output current at a first current source, the output current at the first current source being proportional to the inductive element current.

In accordance to some embodiments, a method for sensing inductive element current is provided. The method includes creating a voltage analog of the inductive element current of an inductive element of a switched mode power supply, the voltage analog being created by integrating the inductive element current between a first potential at a first end of the inductive element and a second potential at a second end of the inductive element, the voltage analog being provided across a capacitor of a voltage integration circuit, and the voltage integration circuit being electrically connected in parallel to the inductive element of the switched power mode supply. The method further includes amplifying the voltage analog provided across the capacitor through a gain circuit, the voltage analog being amplified from a third potential on a first end of the capacitor to a fourth potential and being amplified from the second potential on a second end of the capacitor to a fifth potential, a first end of the gain circuit being electrically connected across the capacitor of the voltage integration circuit, and the amplified analog voltage being provided across a second end of the gain circuit. The method further including injecting matched currents through the second end of the gain circuit using an amplifier in feedback, the amplifier being electrically connected to the second end of the gain circuit, and an output of the amplifier being connected to at least two matched current sources configured to inject the matched currents to the second end of the gain circuit. The method further comprising replicating the matched currents as an output current at a first matched current source of a replication circuit, the output current at the first matched current source being proportional to an inductive element current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
an inductive element;
a voltage integration circuit connected in parallel to the inductive element, wherein the voltage integration circuit is configured to integrate an inductive element current of the inductive element between a first potential at a first end of the inductive element and a second potential at a second end of the inductive element, wherein the voltage integration circuit is configured to integrate the inductive element current to provide a voltage analog of the inductive element current; and
a voltage current convertor circuit electrically connected to the voltage integration circuit, wherein the voltage current convertor circuit is configured to convert the voltage analog to an output current, wherein the output current is proportional to the inductive element current, wherein the voltage current convertor circuit comprises a gain circuit, a feedback circuit, and a replication circuit, wherein the gain circuit is electrically connected to the voltage integration circuit and is configured to amplify the voltage analog, wherein the feedback circuit is electrically connected to the gain circuit and is configured to inject matched currents into the gain circuit, and wherein the replication circuit is electrically connected to the feedback circuit and is configured to replicate the matched currents as the output current.

2. The circuit of claim 1, wherein the voltage integration circuit comprises a first resistive element and a first electrical storage element electrically connected in series with the first resistive element, and wherein the voltage integration circuit is configured to provide the voltage analog across the first electrical storage element.

3. The circuit of claim 2, wherein the gain circuit is configured to amplify the analog voltage across the first electrical storage element to a fourth potential at a first output point and to a fifth potential at a second output point at the second end of the gain circuit.

4. The circuit of claim 3, wherein the feedback circuit comprises an amplifier, a first current source, and a second current source, wherein a first input point of the amplifier is electrically connected to the first output point of the gain circuit, wherein a second input point of the amplifier is electrically connected to the second output point of the gain circuit, wherein an output point of the amplifier is electrically connected to the first current source and the second current source, and wherein the amplifier is configured to drive the first current source and the second current source to inject the matched currents into the gain circuit such that the fourth potential and the fifth potential are substantially same.

5. The circuit of claim 4, wherein the feedback circuit further comprises an offset current source connected across one of the following: the first current source and the second current source.

6. The circuit of claim 4, wherein the replication circuit is electrically connected to the feedback circuit and comprises a third current source, wherein the output point of the amplifier is connected to the third matched current source, and wherein the third current source is configured to provide the output current that is proportional to the inductive element current.

7. The circuit of claim 5, wherein a ratio of the output current to the inductive element current is determined as DCR/(R1+R2−R3), wherein DCR is a resistance value of the inductive element, R1 is resistance value of the first resistive element, R2 is resistance value of a second resistive element, R3 is resistance value of a third resistive element, wherein the second resistive element and the third resistive element form the gain circuit.

8. A circuit, comprising:
an integration circuit electrically connected in parallel to an inductive element, wherein the integration circuit is configured to provide a voltage analog of an inductive element current flowing through the inductive element;
a gain circuit comprising a first end and a second end, wherein the first end of the gain circuit is electrically connected to the integration circuit, and wherein the gain circuit is configured to amplify the voltage analog and provide the amplified voltage analog at the second end;
a feedback circuit electrically connected to the second end of the gain circuit, wherein the feedback circuit is configured to drive matched currents into the gain circuit using an amplifier in feedback; and
a replication circuit electrically connected to the feedback circuit, wherein the replication circuit is configured to replicate the matched currents as an output current at a first current source, wherein the output current at the first current source is proportional to the inductive element current.

9. The circuit of claim 8, wherein the integration circuit comprises a RC circuit comprising a first resistive element connected in series to a first electrical storage element, and wherein the RC circuit is electrically connected in parallel to the inductive element.

10. The circuit of claim 9, wherein a temperature coefficient of first resistive element is substantially similar to the temperature coefficient of a direct current (DC) resistance of the inductive element.

11. The circuit of claim 9, wherein the gain circuit comprises a second resistive element and a third register electrically connected in parallel across the first electrical storage element, and wherein a temperature coefficient of first resistive element is substantially similar to the temperature coefficient of a direct current (DC) resistance of the inductive element.

12. The circuit of claim 11, wherein the feedback circuit comprises the amplifier, a second current source, and a third current source, wherein the second current source is electrically connected to the second resistive element and is configured to inject a first matched current into the gain circuit, wherein the third current source is electrically connected to the third resistive element and is configured to inject a second matched current into the gain circuit, wherein the amplifier is electrically connected to both the second current source and the third current source, and wherein the amplifier is configured to control an amount of the matched currents being injected to the gain circuit.

13. The circuit of claim 12, wherein the second current source and the third current source are matched current sources.

14. The circuit of claim 12, wherein the amplifier is configured control the amount of the matched currents to create a substantially same potential across output points of the gain circuit.

15. The circuit of claim 12, wherein the amplifier is configured to drive the first current source to provide the output current that is proportional to the inductive element current.

16. The circuit of claim 15, wherein a ratio of the output current and the inductive element current is determined as DCR/(R1+R2−R3), wherein DCR is a DC resistance value of the inductive element, R1 is a resistance value of the first resistive element, R2 is a resistance value of the second resistive element, and R3 is resistance value of the third resistive element.

17. The circuit of claim 16, wherein a waveform of the inductive element current is replicated at the output current.

18. A method comprising:
creating a voltage analog of an inductive element current, wherein creating a voltage analog comprises integrating the inductive element current of an inductive element between a first potential at a first end of the inductive element and a second potential at a second end of the inductive element through a voltage integration circuit, wherein the voltage integration circuit connected in parallel to the inductive element;
amplifying the voltage analog through a gain circuit comprising a first end and a second end, wherein the first end of the gain circuit is electrically connected to the integration circuit, and where in the gain circuit provides the amplified voltage at the second end;
injecting currents into the gain circuit using an amplifier in feedback, wherein the amplifier in feedback is connected to the second end of the gain circuit and is configured to drive matched currents into the gain circuit; and
replicating the injected currents as an output current at a first current source of a replication circuit, wherein the replication circuit is connected to the amplifier in feedback and is configured to replicate the matched currents as the output current at the first current source, and wherein the output current at the first current source is proportional to the inductive element current.

19. The method of claim 18, wherein injecting the currents into the gain circuit comprises driving a first current of a second current source and a second current of a third current source such that a potential different at output points of the gain circuit is substantially zero.

* * * * *